US008937317B2

(12) United States Patent
Disney et al.

(10) Patent No.: US 8,937,317 B2
(45) Date of Patent: Jan. 20, 2015

(54) METHOD AND SYSTEM FOR CO-PACKAGING GALLIUM NITRIDE ELECTRONICS

(71) Applicant: Avogy, Inc., San Jose, CA (US)

(72) Inventors: Donald R. Disney, Cupertino, CA (US); Hemal N. Shah, San Mateo, CA (US)

(73) Assignee: Avogy, Inc., San Jose, CA (US)

( * ) Notice: Subject to any disclaimer, the term of this patent is extended or adjusted under 35 U.S.C. 154(b) by 45 days.

(21) Appl. No.: 13/730,619

(22) Filed: Dec. 28, 2012

(65) Prior Publication Data
US 2014/0183543 A1 Jul. 3, 2014

(51) Int. Cl.
H01L 31/0256 (2006.01)
H01L 27/06 (2006.01)
H01L 23/00 (2006.01)
H01L 29/872 (2006.01)

(52) U.S. Cl.
CPC ............ H01L 27/0629 (2013.01); H01L 24/80 (2013.01); H01L 29/872 (2013.01)
USPC ............................................ 257/76; 438/123

(58) Field of Classification Search
None
See application file for complete search history.

(56) References Cited

U.S. PATENT DOCUMENTS

| 4,805,003 | A | 2/1989 | Holm et al. |
| 7,031,971 | B1 | 4/2006 | Taillefer |
| 7,109,100 | B2 | 9/2006 | Nakamura |
| 7,139,892 | B2 | 11/2006 | Peinado et al. |
| 7,355,223 | B2 | 4/2008 | Harris et al. |
| 7,592,647 | B2 | 9/2009 | Nakata et al. |
| 7,653,832 | B2 | 1/2010 | Faibish et al. |
| 7,711,923 | B2 | 5/2010 | Rogers et al. |
| 7,802,063 | B1 | 9/2010 | Chatterjee et al. |
| 7,863,649 | B2 | 1/2011 | Hikita et al. |
| 7,873,619 | B1 | 1/2011 | Faibish et al. |
| 7,873,782 | B2 | 1/2011 | Terry et al. |
| 7,875,538 | B2 | 1/2011 | Matsuda |
| 7,991,946 | B2 | 8/2011 | Lee et al. |

(Continued)

FOREIGN PATENT DOCUMENTS

| WO | 9913403 | 3/1999 |
| WO | 2011013500 | 2/2011 |

OTHER PUBLICATIONS

International Search Report and Written Opinion mailed Feb. 11, 2013 in PCT/US2012/066669, 10 pages.

(Continued)

Primary Examiner — Julio J Maldonado
Assistant Examiner — Robert Bachner
(74) Attorney, Agent, or Firm — Kilpatrick Townsend & Stockton LLP

(57) ABSTRACT

An electronic package includes a leadframe, a plurality of pins, a gallium-nitride (GaN) transistor, and a GaN diode. The GaN transistor includes a drain region, a drift region, a source region, and a gate region; the drain region includes a GaN substrate and a drain contact, the drift region includes a first GaN epitaxial layer coupled to the GaN substrate, the source region includes a source contact and is separated from the GaN substrate by the drift region, and the gate region includes a second GaN epitaxial layer and a gate contact. The GaN diode includes an anode region and a cathode region, the cathode region including the GaN substrate and a cathode contact, and the anode region including a third GaN epitaxial layer coupled to the GaN substrate and an anode contact. The drain contact and the anode contact are electrically connected to the leadframe.

11 Claims, 5 Drawing Sheets

(56) References Cited

U.S. PATENT DOCUMENTS

| | | | |
|---|---|---|---|
| 8,032,637 B2 | 10/2011 | Prince, Jr. et al. | |
| 8,041,907 B1 | 10/2011 | Wu et al. | |
| 8,041,924 B2 | 10/2011 | Strange et al. | |
| 8,466,017 B2 | 6/2013 | Sheridan et al. | |
| 8,502,234 B2 | 8/2013 | Kizilyalli | |
| 8,698,164 B2 | 4/2014 | Disney | |
| 8,788,788 B2 | 7/2014 | Colgrove | |
| 2001/0032999 A1 | 10/2001 | Yoshida | |
| 2002/0003245 A1 | 1/2002 | Kato et al. | |
| 2002/0087544 A1 | 7/2002 | Selkirk et al. | |
| 2004/0124435 A1 | 7/2004 | D'Evelyn et al. | |
| 2007/0029573 A1 | 2/2007 | Cheng et al. | |
| 2007/0090481 A1 | 4/2007 | Richieri | |
| 2007/0096167 A1 | 5/2007 | Francis et al. | |
| 2008/0265326 A1 | 10/2008 | Hebert | |
| 2009/0267078 A1 | 10/2009 | Mishra et al. | |
| 2009/0269896 A1 | 10/2009 | Chen et al. | |
| 2010/0025693 A1* | 2/2010 | Malhan et al. | 257/76 |
| 2010/0025730 A1 | 2/2010 | Heikman et al. | |
| 2010/0124814 A1 | 5/2010 | Arena | |
| 2010/0148186 A1 | 6/2010 | Sheridan et al. | |
| 2010/0153620 A1 | 6/2010 | Mckean et al. | |
| 2010/0327318 A1 | 12/2010 | Okamoto et al. | |
| 2011/0012169 A1 | 1/2011 | Takizawa et al. | |
| 2011/0167221 A1 | 7/2011 | Pangal et al. | |
| 2011/0204381 A1* | 8/2011 | Okada et al. | 257/76 |
| 2011/0210377 A1 | 9/2011 | Haeberlen et al. | |
| 2012/0012968 A1 | 1/2012 | Konsek | |
| 2012/0037918 A1 | 2/2012 | Miyazaki et al. | |
| 2012/0049372 A1 | 3/2012 | Hamerski | |
| 2012/0068186 A1* | 3/2012 | Otremba | 257/76 |
| 2012/0223337 A1 | 9/2012 | Terano et al. | |
| 2013/0032814 A1 | 2/2013 | Bour | |
| 2013/0087879 A1 | 4/2013 | Edwards et al. | |
| 2013/0126885 A1 | 5/2013 | Disney et al. | |
| 2013/0153963 A1 | 6/2013 | Shealy et al. | |
| 2014/0021479 A1 | 1/2014 | Hyland | |
| 2014/0070226 A1 | 3/2014 | Alvarez | |

OTHER PUBLICATIONS

International Search Report and Written Opinion mailed Oct. 10, 2012 in PCT/US2012/050490, 11 pages.
Office Action mailed Oct. 4, 2013 in U.S. Appl. No. 13/198,666, 17 pages.
Office Action mailed Feb. 26, 2014 in U.S. Appl. No. 13/198,666, 23 pages.
Office Action mailed Jun. 9, 2014 in U.S. Appl. No. 13/198,666, 23 pages.
Office Action mailed Nov. 27, 2013 in U.S. Appl. No. 13/552,365, 17 pages.
Office Action mailed Apr. 25, 2014 in U.S. Appl. No. 13/552,365, 12 pages.
Office Action mailed Oct. 10, 2013 in U.S. Appl. No. 13/611,467, 23 pages.
Office Action mailed Apr. 11, 2014 in U.S. Appl. No. 13/611,467, 23 pages.
Office Action mailed Jun. 19, 2014 in U.S. Appl. No. 13/611,467, 15 pages.

* cited by examiner

METHOD AND SYSTEM FOR CO-PACKAGING GALLIUM NITRIDE ELECTRONICS

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to co-packaging gallium nitride (GaN) electronics. Merely by way of example, the invention has been applied to methods and systems for manufacturing GaN power devices. The methods and techniques can be applied to a variety of semiconductor devices, such as metal-oxide-semiconductor field-effect transistors (MOSFETs), bipolar transistors (BJTs, HBTs), diodes, and the like.

According to an embodiment of the present invention, an electronic package is provided. The electronic package includes a leadframe, a plurality of pins, a gallium-nitride (GaN) transistor, and a GaN diode. The GaN transistor includes a drain region, a drift region, a source region, and a gate region. The drain region includes a GaN substrate and a drain contact, the drift region includes a first GaN epitaxial layer coupled to the GaN substrate, the source region includes a source contact and is separated from the GaN substrate by the drift region, and the gate region includes a second GaN epitaxial layer coupled to the first GaN epitaxial layer and a gate contact. The GaN diode includes an anode region and a cathode region, the cathode region including the GaN substrate and a cathode contact, and the anode region including a third GaN epitaxial layer coupled to the GaN substrate and an anode contact. The drain contact and the anode contact are electrically connected to the leadframe.

According to another embodiment of the present invention, a method of fabricating an electronic package is provided. The method includes providing the electronic package having a leadframe and a plurality of pins. The method further includes providing a GaN transistor having a drain contact, a source contact, and a gate contact, and joining the drain contact to the leadframe. A GaN diode is also provided, the GaN diode having an anode contact and a cathode contact. The method further includes joining the anode contact to the leadframe.

Numerous benefits are achieved by way of the present invention over conventional techniques. For example, embodiments of the present invention reduce the physical electronic package size of the power circuit when using GaN devices (e.g., a transistor, a diode, or the like) while still delivering high voltage and current ratings, which would, using conventional techniques, result in large, heavy packages. Capacitance may also be reduced as a result of smaller package sizes of GaN circuits, thereby reducing electromagnetic interference (EMI). Since GaN devices may be co-packaged closely together, parasitic inductance, resistance, and capacitance associated with interconnections between devices may be substantially reduced.

Additionally, GaN circuits are capable of operating at much higher frequencies than conventional silicon circuits without sacrificing power performance. Power electronics using conventional techniques may increase power loss and EMI when operated at higher frequencies. However, GaN power electronics reduce power loss and EMI, even at high frequencies.

Furthermore, co-packaged GaN power devices may provide more cost-effective solutions. For example, the GaN power electronics described herein co-package two GaN power devices (e.g., a transistor and a diode), such that only one electronic package and one heat sink is utilized. Co-packaging GaN devices also results in easier assembly of the electronic packages, less board space, and therefore less cost for the board and its enclosure. These and other embodiments of the present invention, along with many of its advantages and features, are described in more detail in conjunction with the text below and attached figures.

DETAILED DESCRIPTION OF SPECIFIC EMBODIMENTS

Figure 1:
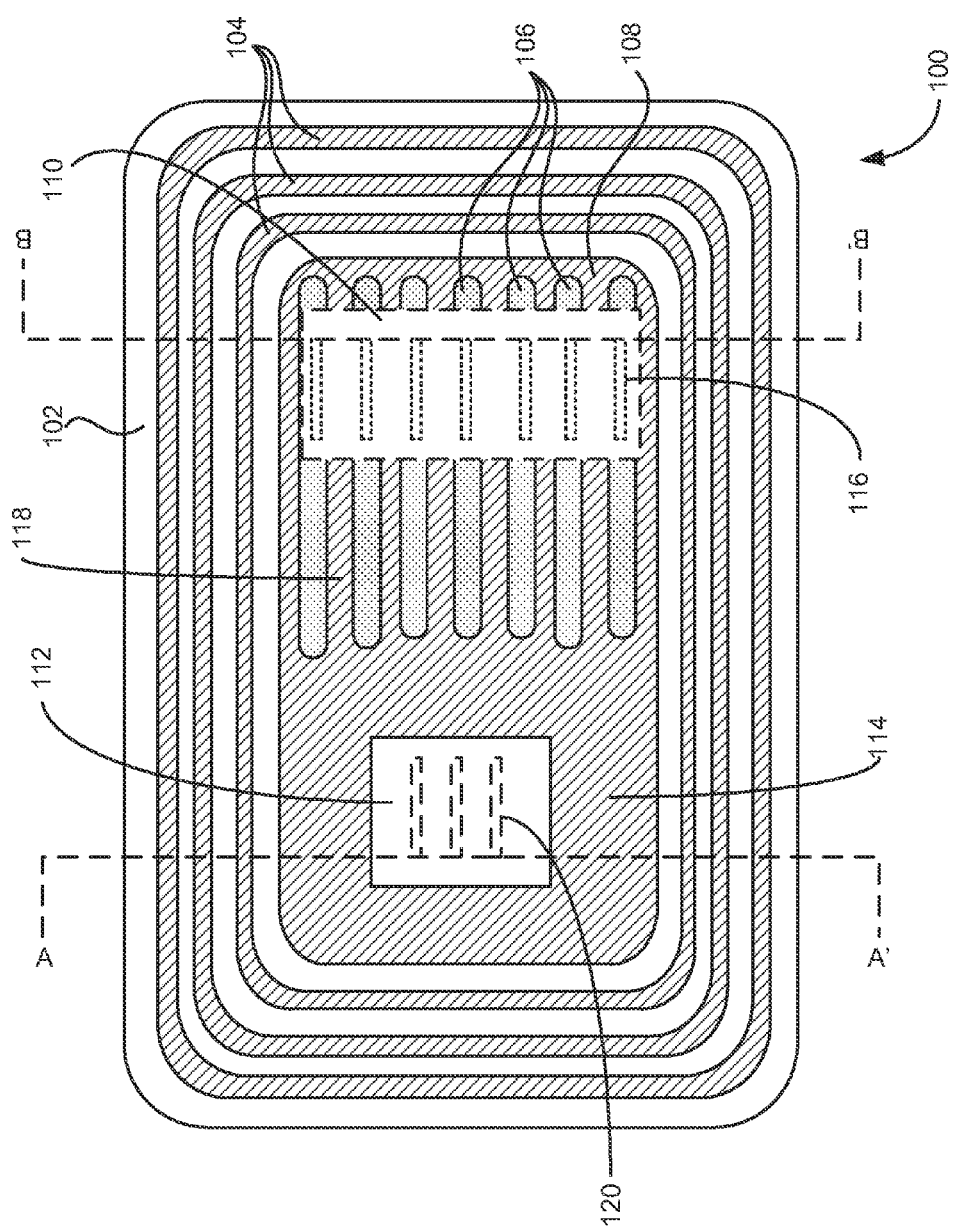
FIG. 1 illustrates a top view of a GaN power device according to an embodiment of the present invention.

The present invention relates generally to electronic devices. More specifically, the present invention relates to co-packaging GaN electronics. Merely by way of example, the invention has been applied to methods and systems for manufacturing GaN power devices. The methods and techniques can be applied to a variety of vertical semiconductor devices, such as junction field-effect transistors (JFETs), metal-oxide-semiconductor field-effect transistors (MOSFETs), bipolar transistors (BJTs, HBTs), diodes, and the like.

GaN-based electronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$, is higher than competing materials for a given background doping level, N. This provides low resistivity, $\rho$, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

The superior properties of GaN can give rise to improved semiconductor devices, especially power semiconductor devices. Prior art GaN power devices are typically lateral devices that utilize only the top side of a semiconductor wafer, locating electrical contacts such that electricity travels laterally along the semiconductor surface. This tends to consume a large surface area on the semiconductor. Vertical semiconductor devices, on the other hand, utilize a smaller surface area to achieve the same performance (i.e., forward current conduction capability) as lateral devices. Vertical semiconductor devices have electrical contacts on both the top surface of the semiconductor and on the bottom surface, or backside, such that electricity flows vertically between the electrical contacts. Vertical power devices are vertical semiconductor devices that can be utilized in high power and/or high voltage applications, such as power electronics.

A boost circuit may be used in power electronics to effectively boost a lower input voltage to a higher output voltage. Boost circuits may typically include a transistor, acting as a switch, and a diode. In a boost circuit using traditional power semiconductor devices, such as silicon power devices, the transistor and diode are typically devices that are packaged separately. The boost circuit according to an embodiment of the present invention comprises a GaN power transistor and a GaN power diode that both utilize a vertical architecture and are co-packaged together into a single electronic package. For a given voltage and current rating, GaN power devices may be significantly smaller than their silicon counterparts. For example, a 600V, 5 A GaN power device may have a surface area that is 100 times smaller than a 600V, 5 A silicon power device. Vertical GaN power devices may also be operated at much higher frequencies (e.g., 500 kHz-20 MHz) compared to vertical silicon power devices (e.g., up to 1 MHz) without an increase in power loss. Embodiments of the present invention enable operation at high frequencies with greatly reduced noise, EMI, and power loss, by reducing or minimizing the parasitic inductance, resistance, and capacitance of the boost circuit.

The GaN transistor and GaN diode are co-packaged into a single electronic package to provide a total solution that is much smaller than what can be achieved by packaging the transistor separately from the diode into two electronic packages, or co-packaging a silicon transistor with a silicon diode. The capacitance of a power semiconductor device generally scales with area, so GaN power devices generally have much lower capacitance than similarly rated silicon power devices. Package-related capacitance also scales with size, so the electronic package-related capacitance is also greatly reduced as a result of smaller package sizes associated with GaN circuits. These lower capacitances provide greatly reduced switching losses for GaN power devices in comparison to similarly rated silicon power devices. Due to their small size, GaN devices may be co-packaged closely together, and parasitic inductance, resistance, and capacitance associated with interconnections between devices may be substantially reduced as the interconnection (e.g., current path) between these devices is made through a highly-conductive leadframe. Reducing these parasitic inductances greatly reduces electromagnetic interference (EMI), especially at high switching frequencies, and also reduces the over-voltage stress on the power semiconductor devices and other power electronic circuit elements. As a result, power electronics according to embodiments of the invention provide benefits and advantages such as faster switching, lower power loss, and less EMI than achieved with conventional approaches.

FIG. 1 illustrates a top-view of a GaN power transistor 100 including guard rings according to an embodiment of the present invention. Processes for the fabrication of vertical power transistor 100 is provided in commonly assigned U.S. patent application Ser. No. 13/289,219, filed on Nov. 4, 2011, the disclosure of which is hereby incorporated by reference.

GaN power transistor 100 includes a first gallium nitride layer 102 that is coupled to a substrate (not shown). In some embodiments, the substrate is a gallium nitride substrate. In some embodiments, first gallium nitride layer 102 can include an epitaxially grown gallium nitride layer, e.g., GaN that has n-type conductivity. First gallium nitride layer 102 can serve as a drift region and therefore can be a relatively low-doped material. For example, first gallium nitride layer 102 can have an n-conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region. In some embodiments, n-type dopants can include silicon, oxygen, selenium, tellurium, or the like.

The thickness of first gallium nitride layer 102 can also vary substantially, depending on the desired functionality. As discussed above, homoepitaxial growth can enable first gallium nitride layer 102 to be grown far thicker than heteroepitaxial GaN layers formed on non-GaN substrates. Thicknesses can vary between 0.5 µm and 100 µm, for example. In some embodiments thicknesses are greater than 5 µm. Resulting parallel plane breakdown voltages for GaN power transistor 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

A second gallium nitride layer 108 can be epitaxially grown over first gallium nitride layer 102. Second gallium nitride layer 108, from which edge termination structures 104 are eventually formed, can have a conductivity type different than first gallium nitride layer 102. For instance, if first gallium nitride layer 102 is formed from an n-type GaN material, second gallium nitride layer 108 may be formed from a p-type GaN material, and vice versa. In some embodiments, second gallium nitride layer 108 is used to form the edge termination structures and is a continuous regrowth over portions of first gallium nitride layer 102 with other portions of the structure, such as regions of other semiconductor devices, characterized by reduced or no growth as a result of the presence of a regrowth mask (not shown). One of ordinary skill in the art would recognize many variations, modifications, and alternatives.

The thickness of second gallium nitride layer 108 can vary, depending on the process used to form the layer and the device design. In some embodiments, the thickness of second gallium nitride layer 108 is between 0.1 μm and 5 μm.

Second gallium nitride layer 108 can be highly doped, for example in a range from about $5 \times 10^{17}$ cm$^{-3}$ to about $1 \times 10^{19}$ cm$^{-3}$. Additionally, as with other epitaxial layers, the dopant concentration of second gallium nitride layer 108 can be uniform or non-uniform as a function of thickness. In some embodiments, the dopant concentration increases with thickness, such that the dopant concentration is relatively low near first gallium nitride layer 102 and increases as the distance from first gallium nitride layer 102 increases. Such embodiments provide higher dopant concentrations at the top of second gallium nitride layer 108 where metal contacts can be subsequently formed. Other embodiments utilize heavily doped contact layers (not shown) to form Ohmic contacts.

One method of forming second gallium nitride layer 108, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety. Second gallium nitride layer 108 can be used to form the gate region of vertical power transistor 100.

GaN power transistor 100 may also include an edge termination region. In the embodiment shown in FIG. 1, the edge termination region comprises one or more edge termination structures 104. In one embodiment, edge termination structures 104 are formed by removing at least a portion of second gallium nitride layer 108. The removal can be performed by a controlled etch using an etch mask (not shown but having the dimensions of the edge termination structures 104) designed to stop at approximately the interface between second gallium nitride layer 108 and first gallium nitride layer 102. Inductively-coupled plasma (ICP) etching and/or other common GaN etching processes can be used. In other embodiments, edge termination structures 104 may be formed by implanting ions into portions of second gallium nitride layer 108 to electrically isolate edge termination structures 104. In still other embodiments, the edge termination region may comprise a junction-termination extension (JTE) region, one or more field plates, deep trench termination, and/or a combination of these or other edge termination structures.

As illustrated in FIG. 1, second gallium nitride layer/gate region 108 includes a continuous region 114 and one or more finger-like projections 118. Together, the continuous region 114 and projections 118 form the gate region of vertical power transistor 100. A gate electrode 112 is disposed over continuous region 114 and coupled to gate region 108 via gate contacts 120. In some embodiments, gate electrode 112 can include metals such as scandium, nickel, platinum, palladium, silver, gold, copper, aluminum, etc. and alloys thereof. In some embodiments, gate electrode 112 can be a multi-layered structure.

In one embodiment, at least some portions of the gate region may also include a low resistance layer (not shown) that may be disposed on top of the second gallium nitride layer. This low resistance layer may comprise a metal such as scandium, platinum, palladium, nickel, or other suitable materials. The purpose of this layer is to reduce the lateral resistance from gate electrode 112 to various locations on the gate region, which may be advantageous to reduce the distributed gate resistance of vertical power transistor 100 and, thus, improve the switching performance.

First gallium nitride layer 102 can be patterned and etched to form channel regions 106. Channel regions 106 are disposed such that there is one channel region in between two adjacent finger-like gate structures 118. These together form the p-n junction of a diode. Details of the placement of the source and gate structures are described more fully below. In one embodiment, a third gallium nitride layer (not shown) is coupled to first gallium nitride layer 102 and is etched to form channel regions 106. A source electrode 110 is coupled to channel regions 106 via source contacts 116. In some embodiments, source regions are interposed between channel regions 106 and source contacts 116, as described in reference to FIG. 3 below. In some embodiments, source electrode 110 can include metals such as scandium, titanium, aluminum, nickel, gold, copper, etc. and alloys thereof. In some embodiments, source electrode 110 can be a multi-layered structure.

As illustrated in FIG. 1, both source electrode 110 and gate electrode 112 are disposed within the edge termination region. This helps to isolate the low voltage gate and source electrodes from the high voltage of first gallium nitride layer 102. Connections to external systems can be made via electrodes 110 and 112 using wire bonding or other conventional techniques.

Although some embodiments are discussed in terms of a GaN substrate, embodiments of the present invention are not limited to GaN substrates. Other III-V materials, in particular, III-nitride materials, are included within the scope of the present invention and can be substituted not only for the illustrative GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are also included within the scope of the present invention.

The GaN power transistor 100 utilizes an n-type drift layer that is grown on top of an n-type substrate. However, the present invention is not limited to this particular configuration. In other embodiments, substrates with p-type doping can be utilized. Additionally, embodiments can use materials having an opposite conductivity type to provide devices with different functionality. Thus, although some embodiments described herein include n-type GaN epitaxial layer(s) doped with silicon, other n-type dopants may be used, such as Ge, Se, S, O, Te, and the like. In other embodiments, highly or lightly doped material, p-type material, material doped with dopants such as Mg, Ca, Be, and the like can also be used. The substrates discussed herein can include a single material system or multiple material systems including composite structures of multiple layers. One of ordinary skill in the art would recognize many variations, modifications, and alternatives.

Figure 2:
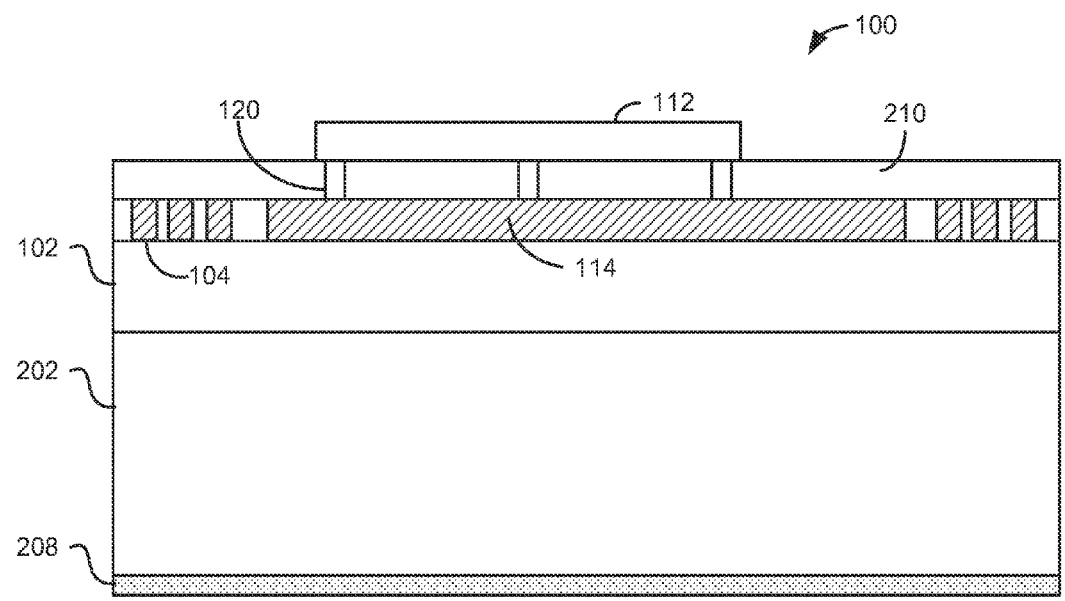
FIG. 2 is a cross-sectional view along the A-A' direction illustrated in FIG. 1.

FIG. 2 illustrates a cross-sectional view of GaN power transistor 100 taken along the A-A' line illustrated in FIG. 1. As described, current flow through the GaN power transistor occurs in a substantially vertical direction (referenced to the horizontal bottom surface of the substrate in the illustrations). Accordingly, embodiments of the present invention can be referred to as vertical GaN transistors or vertical power transistors. As illustrated in FIG. 2, vertical power transistor 100 includes a GaN substrate 202. A first GaN epitaxial layer 102 is coupled to and disposed over a surface of GaN substrate 202. A drain electrode 208 is coupled to an opposing surface of GaN substrate 202. In one embodiment, drain electrode 208 is formed from indium, titanium, aluminum, nickel, gold, or similar materials to provide an Ohmic contact. A second GaN epitaxial layer is disposed over and coupled to first GaN epitaxial layer 102. The second GaN epitaxial layer comprises continuous gate structure 114 and an edge termination region. As discussed above, the edge termination region may comprise multiple edge termination structures. The example of FIGS. 1 and 2 show three edge termination structures 104.

An interlayer dielectric layer (ILD) 210 is disposed over the gate structure 114 and edge termination structures 104. One or more gate contacts 120 are formed in ILD 210 to provide electrical connection between gate structure 114 and gate electrode 112. As can be seen, gate electrode 112 is located such that edge termination structures 104 completely surround gate electrode 112, thereby isolating gate electrode 112 from the high voltage present on the portion of first GaN epitaxial layer 102 that lies outside of the edge termination region.

Figure 3:
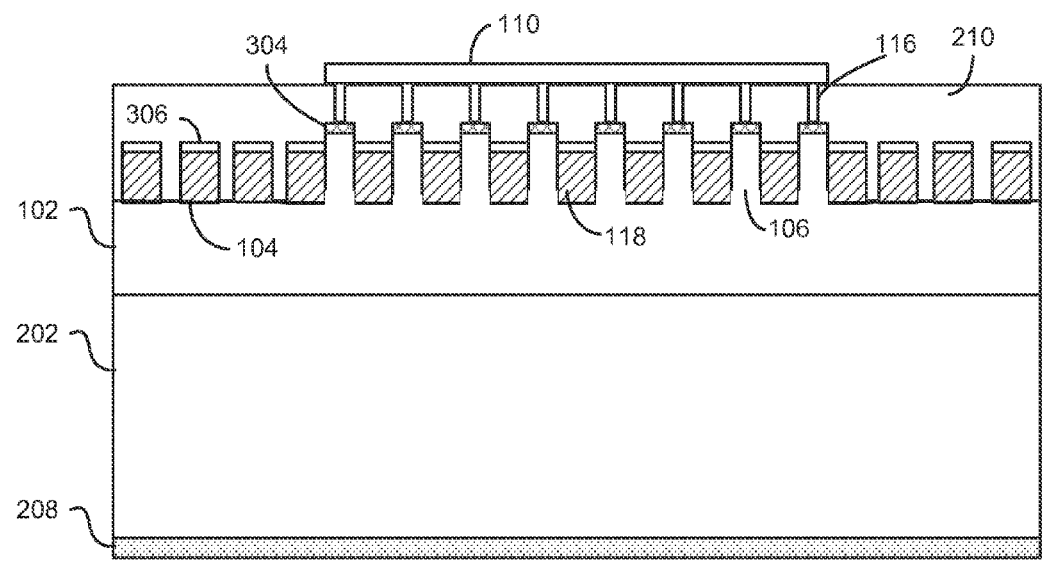
FIG. 3 is a cross-sectional view along the B-B' direction illustrated in FIG. 1.

FIG. 3 illustrates a cross section view of vertical power transistor 100 at the B-B' line illustrated in FIG. 1. As illustrated in FIG. 3, channel regions 106 are disposed between adjacent finger-like projections 118 of gate region 108, creating p-n junctions. In one embodiment, a low resistance layer 306 is disposed on top of the at least some portions of gate region 108 and/or edge structures 104. Low resistance layer 306 may comprise a metal such as platinum, palladium, nickel, or other suitable materials. The purpose of low resistance layer 306 is to reduce the lateral resistance from gate electrode 112 to various locations on the gate region, which may be advantageous to reduce the distributed gate resistance of vertical power transistor 100 and, thus, improve the switching performance.

Source regions 304 are disposed on the top of channel regions 106. Source regions 304 may have the same conductivity type (e.g. N-type) as channel regions 106 and substrate 202. The doping concentration of source regions 304 may be substantially higher than the doping concentration of channel regions 106 in order to form a better Ohmic contact. Source electrode 110 is located such that edge termination structures 104 completely surround source electrode 110, thereby isolating source electrode 110 from the high voltage present on the portion of first GaN epitaxial layer 102 that lies outside of the edge termination region. Source region 304 is electrically coupled to source electrode 110 via source contacts 116. In one embodiment, source regions 304 are electrically isolated from gate region 108. For example, as shown in FIG. 3, the tops of finger-like projections 118 may be recessed below the tops of source regions 304 to provide electrical isolation.

In some embodiments, GaN substrate 202 can have an n+ conductivity type with dopant concentrations ranging from $1 \times 10^{17}$ cm$^{-3}$ to $1 \times 10^{19}$ cm$^{-3}$, and first GaN epitaxial layer 102 can have a n− conductivity type, with dopant concentrations ranging from $1 \times 10^{14}$ cm$^{-3}$ to $1 \times 10^{18}$ cm$^{-3}$. The thickness of first GaN epitaxial layer 102 can be anywhere from 0.5 μm and 100 μm or higher, depending on desired functionality and breakdown voltage. Channel region 106 can have a height of between 0.5 μm and 5 μm, a width of between 0.5 μm and 5 μm, and a n-type conductivity with a dopant concentration that is the same as or lower than the dopant concentration of first GaN epitaxial layer 102. In one embodiment, channel region 106 can be formed by etching away portions of first GaN epitaxial layer 102. Gate region 108 and the edge termination structures 104 can be from 0.1 μm and 5 μm thick and have a p+ conductivity type with dopant concentrations in a range from about $1 \times 10^{17}$ cm$^{-3}$ to about $1 \times 10^{19}$ cm$^{-3}$.

Figure 4:
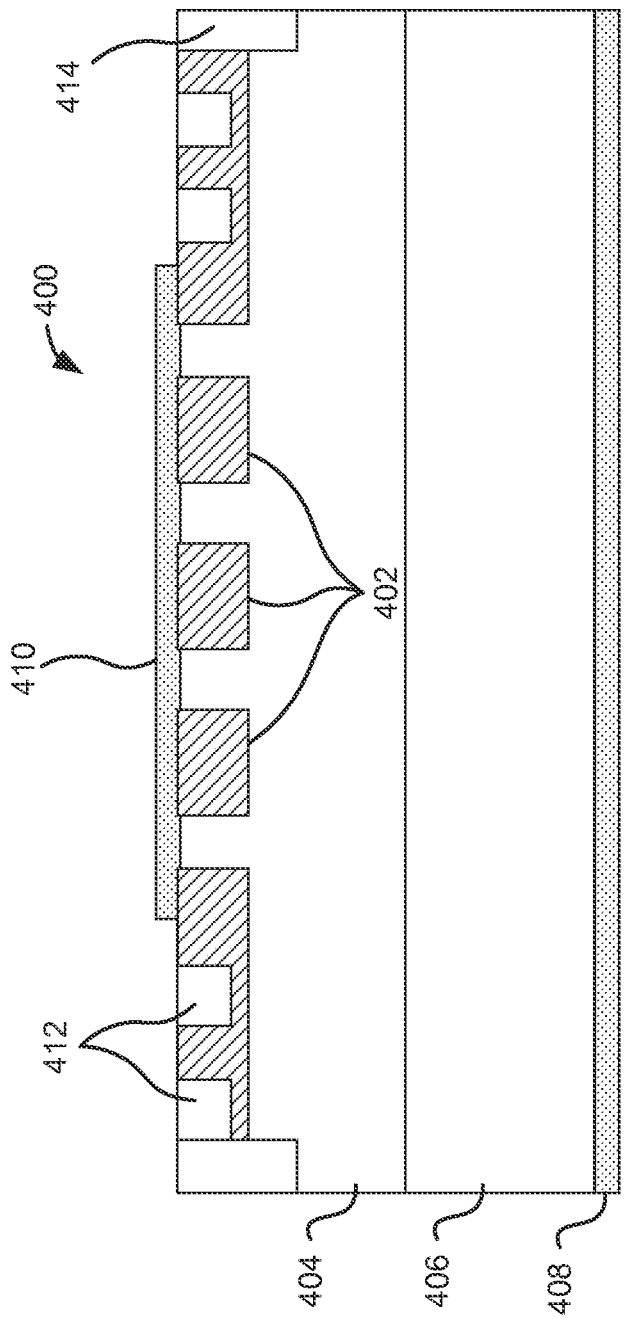
FIG. 4 is a cross-sectional view of a GaN diode according to an embodiment of the present invention.

FIG. 4 illustrates a cross-sectional view of vertical GaN power diode 400 including GaN substrate 406 and first Gan epitaxial layer 404. Similar to the vertical GaN power transistor described above, GaN substrate 406 can have an n+ conductivity type with dopant concentrations ranging from $1 \times 10^{17}$ cm$^{-3}$ to $1 \times 10^{19}$ cm$^{-3}$, and first GaN epitaxial layer 404 can have a n− conductivity type, with dopant concentrations ranging from $1 \times 10^{14}$ cm$^{-3}$ to $1 \times 10^{18}$ cm$^{-3}$. The thickness of first GaN epitaxial layer 404 can be anywhere from 0.5 μm and 100 μm or higher, depending on desired functionality and breakdown voltage. GaN epitaxial regions 402 have a conductivity type opposite the conductivity type of first GaN epitaxial layer 404. For instance, first GaN epitaxial layer 404 is formed from an n-type GaN material and GaN epitaxial regions 402 are formed from a p-type GaN material. In some embodiments, the epitaxial regions 402 are formed using a continuous regrowth over portions of the first GaN epitaxial layer 404 with other portions of the structure, such as regions between the epitaxial regions 402, characterized by reduced or no growth as a result of the presence of a regrowth mask (not shown). One of ordinary skill in the art would recognize many variations, modifications, and alternatives.

The thickness of the epitaxial regions 402 can vary, depending on the process used to form the layer and the device design. In some embodiments, the thickness of the epitaxial regions 450 is between 0.1 μm and 5 μm. In other embodiments, the thickness of the epitaxial regions 450 is between 0.3 μm and 1 μm.

GaN epitaxial regions 402 can be highly doped with a P-type dopant such as magnesium, for example in a range from about $5 \times 10^{17}$ cm$^{-3}$ to about $1 \times 10^{19}$ cm$^{-3}$. The thickness of GaN epitaxial regions 402 can vary, for example, between 0.1 μm and 5 μm. The dopant concentration of GaN epitaxial regions 402 can be uniform or non-uniform as a function of thickness, depending on desired functionality. In some embodiments, for example, the dopant concentration increases with thickness, such that the dopant concentration is relatively low near first GaN epitaxial layer 404 and increases as the distance from the GaN substrate 406 increases. Such embodiments provide higher dopant concentrations at the top of the epitaxial regions 402 where a metal contact can be subsequently formed. Other embodiments utilize heavily doped contact layers (not shown) to form ohmic contacts.

One method of forming the epitaxial regions 450, and other layers described herein, can be through a regrowth process that uses an in-situ etch and diffusion preparation processes. These preparation processes are described more fully in U.S. patent application Ser. No. 13/198,666, filed on Aug. 4, 2011, the disclosure of which is hereby incorporated by reference in its entirety.

Top metal structure 410 forms an Ohmic electrical contact with at least some of GaN epitaxial regions 402. Top metal structure 410 is also in contact with portions of the first GaN epitaxial layer 404 that extend vertically between GaN epitaxial regions 402. Top metal structure 410 can be one or more layers of metal and/or alloys to create a Schottky barrier with the first GaN epitaxial layer 404. Thus top metal structure 410 forms the anode of a merged PN Schottky (MPS) diode. The cathode of the vertical GaN power diode is formed by bottom metal structure 408, which forms an Ohmic electrical contact with GaN substrate 406.

Some of GaN epitaxial regions 402 are used to provide an edge termination region of MPS diode 400. For example, ion implantation may be used to greatly reduce the conductivity of some areas of some of GaN epitaxial regions 402, as shown by first implanted regions 412, which leave thin conductive portions in some areas of GaN epitaxial regions 402, and by second implanted regions 414, which extend vertically through some areas of GaN epitaxial regions 402 to provide complete electrical isolation.

The MPS diode of FIG. 4 is shown merely by way of example. Many other embodiments of vertical GaN power diodes may be used to facilitate the present invention, including other configurations of MPS diodes, Schottky-barrier diodes, PN diodes, PiN diodes, and the like.

Figure 5:
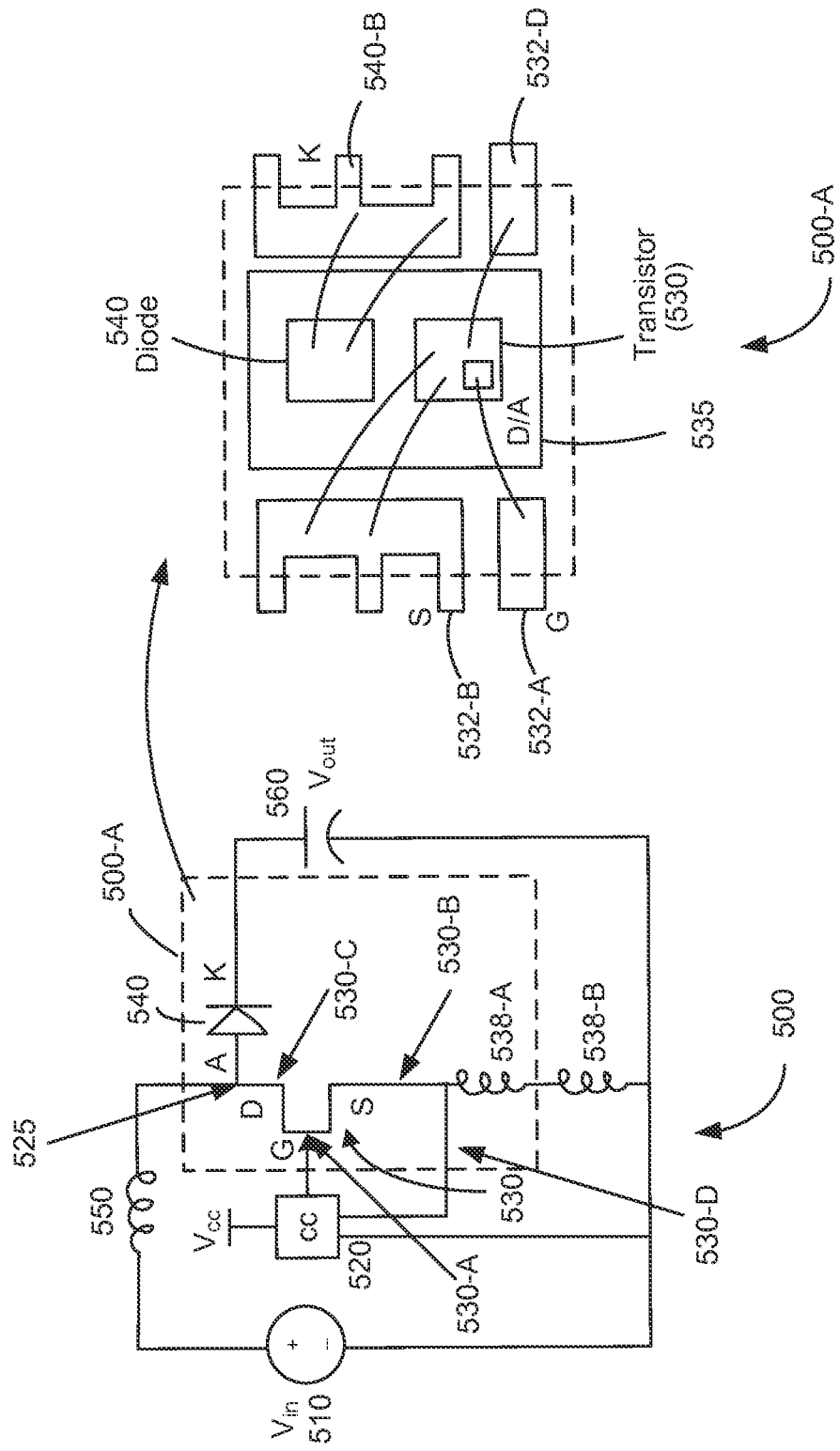
FIG. 5 is a simplified schematic diagram of a co-packaged GaN electronic circuit and device according to an embodiment of the present invention.

FIG. 5 is a simplified schematic diagram of a boost circuit 500 with co-packaged vertical GaN power devices according to an embodiment of the present invention. As illustrated in FIG. 5, the boost circuit 500 includes an input voltage source 510, $V_{in}$, an inductor 550, a power supply $V_{CC}$, a control circuit 520, a vertical GaN power transistor (e.g., switch) 530, a vertical GaN power diode 540, and an output voltage $V_{out}$ across capacitor 560. The boost circuit effectively boosts a voltage from a lower level (e.g., $V_{in}$) to a higher level (e.g., $V_{out}$). This boosting in voltage may be achieved because of the tendency of the inductor 550 to resist changes in current. In a boost circuit, the output voltage $V_{out}$ across capacitor 560 is higher than the input voltage 510 $V_{in}$.

Boost circuits operate by alternating between two states:

(a) On-state: The boost circuit 100 is in an On-state when the transistor 530 is turned on (i.e., the switch is closed), resulting in an increase in the inductor current through inductor 550. When the switch is closed, current flows through the inductor 550 in a clockwise direction and the inductor 550 stores the energy. The polarity of the left side of the inductor 550 then becomes positive. The transistor 530 is turned on by the control circuit 520 as a voltage is applied to a gate 530-A of the transistor, and the switch is closed by inducing current to flow from a drain node 530-C to a source node 530-B of the transistor 530.

(b) Off-state: The boost circuit 100 is in an Off-state when the transistor 530 is turned off by the control circuit 520, opening the switch and preventing current flow from the drain node 530-C to the source node 530-B. The current flows through the diode 540 from an anode terminal (A) to a cathode terminal (K), transferring the energy accumulated in inductor 550 during the On-state into the capacitor 560. The current is then reduced as the impedance increases across capacitor 560 and possibly a load (not shown) in parallel with the capacitor 560. Therefore, a change or reduction in current will be opposed by the inductor 550. Accordingly, the polarity across inductor 550 will be reversed (i.e., the left side of the inductor 550 becomes negative). As a result, two sources (e.g., $V_{in}$ and inductor 550) will be in series causing a higher voltage to charge the capacitor 560 through the diode 540.

When the transistor 530 is cycled fast enough by the control circuit 520, the inductor 550 does not discharge fully in between the alternating states, and the output voltage $V_{out}$ across capacitor 560 will always see a voltage greater than that of the output voltage $V_{out}$ across capacitor 560 when the transistor 530 is turned off (i.e., switch is opened). When the transistor 530 is turned on (i.e., switch is closed), the capacitor 560 is able to provide the output voltage $V_{out}$ and energy to a load (not shown). During this time, the diode 540 prevents the capacitor from discharging through the transistor 530, as current cannot flow through from the cathode terminal (K) to the anode terminal (A) of the diode 540.

Vertical GaN power transistor 530 and vertical GaN power diode 540 are mounted and co-packaged together in electronic package 500-A, which may be very small, compact, and condensed. GaN power devices are smaller in size than comparable silicon power devices or other semiconductor power devices (for example, 10× to 100× smaller). Because they are co-packaged together, the GaN transistor 530 and GaN diode 540 can share a common leadframe 535 for the common drain and anode node 525. The dotted line of electronic package 500-A illustrates an encapsulating material forming a body of the electronic package, with extensions (e.g., pins) 532-A, 532-B, 532-C, and 532-D protruding from the body of the electronic package to be electrically coupled to other connections. The GaN transistor and GaN diode are able to share the same leadframe 535 because the transistor (e.g., the vertical GaN power transistor of FIGS. 1-3) is mounted with its drain 530-C electrically connected to the leadframe 535 of the electronic package, while the diode (e.g., the vertical GaN power diode of FIG. 4) is flipped over such that its anode terminal is electrically connected to leadframe 535. Accordingly, as can be seen in the co-package illustrated in boost circuit 500, node 525 is shared by the drain of transistor 530 and the anode of diode 540.

Referring to FIGS. 2-4, drain electrode 208 coupled to GaN substrate 202 acts as the drain region 530-C of the transistor 530, Referring to FIG. 4, top metal 410 acts as the anode region of the diode 540.

High voltage boost circuits induce high currents, e.g., 5-10 A or more, through the diode and the transistor. Therefore, in one embodiment of the invention, the cathode terminal of the diode may be bonded to multiple cathode pins 532-C. Likewise, the source terminal of the transistor may be bonded to multiple source pins 532-B. The common drain/anode connection may conduct large currents directly through the leadframe 535 of package 500-A.

In another embodiment, an extra Kelvin source 530-D is made available on the electronic package as pin 532-D in order to provide a signal reference for the control circuit 520. This implementation reduces the stray common mode inductance 538-A, in the electronic package and wirebonds, and 538-B, on the circuit board, which can cause dynamic source generation. Rapid transition of current when the transistor 530 turns on or off can occur in a very short time duration owing to the small capacitance of GaN transistors. This di/dt (i.e., change in current over time) of the source current can cause a voltage drop across the stray inductance (V=Lstray*di/dt) and the resultant source degeneration has the effect of causing oscillation and limiting the di/dt capability of the device. The Kelvin sense pin 532-D prevents the di/dt from being fed back into the gate driver circuit.

The gate region 530-A of transistor 530 is electrically coupled to a top metal on transistor 530 and further electrically coupled to gate pin 532-A. In boost circuit 500, control circuit 520 may be electrically coupled to gate region 530-A via the gate pin 532-A. Referring to FIG. 2, the gate electrode 112 corresponds to gate 530-A of transistor 530 in FIG. 5. One or more pins 532-B may extend from the body of the electronic package for the source region 530-B of the transistor 530, which corresponds with the source electrode 110 of FIG. 3.

Vertical GaN power devices may have one or more metal electrodes on a top surface, depending on the type of device. The embodiment in FIG. 4, for example includes a single electrode 410 on the top surface of the vertical GaN power MPS diode 400. On the other hand, as shown in FIGS. 1-3, other embodiments of vertical semiconductor devices, such as transistors, can include multiple metal electrodes 110, 112 in order to achieve additional device functionality. The metal electrodes may be formed from the same metal layers which are patterned into different areas to form multiple electrodes, and these electrodes can be substantially co-planar or at multiple levels depending on the structure of the device layer(s).

Vertical GaN power devices may include electrodes comprising metal layers coupled to the GaN substrate. Backside metals (also referred to herein as "back metals") are metals coupled to a bottom surface of a vertical GaN power device. These backside metals can be utilized in the packaging of GaN devices to provide a mechanical attachment between the GaN device and its housing or package. Backside metals can also provide a thermally conductive pathway for heat to be removed from the semiconductor device via the electronic package. Furthermore, in the case of vertical GaN devices, backside metals can provide a low-resistivity path for current to flow from the GaN substrate to the electronic package. This low resistivity connection facilitating vertical current flow is particularly beneficial for vertical power devices. A backside metal can include one or more metal layers. Furthermore, in some embodiments, multiple metal contacts may be formed from a backside metal, depending on device functionality.

Often, the backside metals on semiconductor devices are not solderable. Lateral current flow devices, for example, typically include all electrical contacts on a top surface of the semiconductor. Therefore, there is no need to electrically connect a backside metal to a package leadframe. Accordingly, in many cases, devices are attached to a package with electrically insulating epoxy or electrically conductive (e.g. silver filled) epoxy, which is much less thermally conductive and has a much higher electrical resistivity than solder. Solder, on the other hand, has very good electrical and thermal conductivity. It is also known for good reliability under temperature cycling and environmental testing using high humidity levels at elevated temperatures. Therefore, for semiconductors requiring electrical and mechanical backside connections, such as vertical power devices, the backside metal of the semiconductor device can be soldered to the metal leadframe of an electronic package.

These techniques for providing a solderable back metal are also discussed in U.S. patent application Ser. No. 13/285,271, filed Jul. 19, 2012, entitled "GAN POWER DEVICE WITH SOLDERABLE BACK METAL."

Other embodiments of this invention include vertical GaN power devices with backside metal that is suitable for other means for attaching the GaN power device to a package leadframe. For example, silver sintering is a method of attaching a semiconductor die to a package (i.e., a die-attach method) which may provide even better electrical and thermal conductivity than solder. A backside metal stack that includes a top layer of gold, silver, or copper may be suitable for use with silver sintering. Another die-attach method that provides excellent electrical and thermal conductivity is eutectic die attach. A backside metal stack that includes a top layer of gold may be suitable for use with eutectic die attach.

In the embodiment of FIG. 5, transistor 530 may utilize a backside metal (i.e. drain electrode) that is compatible with soldering, sintering, or eutectic die attach, such that the backside of the transistor die can be mounted to leadframe 535 with good electrical and thermal conductivity. The topside metal (i.e. anode) of diode 540 may comprise similar metal layers, such that the backside of the diode die can be mounted to leadframe 535 with good electrical and thermal conductivity. Moreover, the transistor die and diode die may share one or more die attach processes.

In some embodiments of the invention, a top metal electrode (e.g., metal 410 of FIG. 4) can include a metal stack with various layers to provide a bondable contact surface such that electrically-conducting structures (bonding wires, ribbons, copper clips, tabs, leads, and the like) may be coupled to the top electrodes during the packaging of a semiconductor device.

The top metal electrodes of a vertical GaN power device can be utilized, along with back metals, to provide a low-resistivity path for current to flow in a vertical direction through the device, from a top surface through the device layer(s) to the bottom surface the GaN substrate, and/or vice versa. This low resistivity connection facilitating vertical current flow is particularly beneficial for vertical power devices and the composition of the top metal contact can provide a bondable electrical contact to the vertical GaN device.

In some embodiments of this invention, the top metal electrode can comprise a diffusion barrier and pad metal. The diffusion barrier, coupled with a protection layer, can help prevent the protection layer from intermixing with other layers placed on top of the diffusion barrier. For example, for a protection layer comprising Au and a pad metal comprising Al, the diffusion barrier can help prevent the protection layer and pad metal from diffusing into each other and forming highly resistive intermetallics, like $Au_5Al_2$ and $AuAl_2$. Furthermore, depending on the composition of the protection layer and pad metal, the diffusion barrier can also act as an adhesion layer. Acceptable materials for the diffusion barrier can include Ni, Mo, Ti, titanium nitride (TiN) and/or Cr. In one embodiment, diffusion barrier includes a bottom layer of Ti, which adheres well to both protection layer and dielectric layer, and an upper layer of Ni, Pt, W, TiW, or similar diffusion barrier layers. The thickness of the diffusion barrier can vary, depending on processing concerns (e.g., coverage), as well as other factors. In some embodiments, for example, the thickness of the diffusion barrier can be between 25 and 400 nanometers thick.

The pad metal provides a bondable surface to which wire (and/or other types) of bonds may be formed. Thick aluminum (Al) wires bonds are commonly used, for example, to form contacts in power electronics. Larger diameter (e.g. 50-500 micron) Al wires provide a high current and low resistance path to the semiconductor device. In some embodiments, the pad metal can comprise Al, which is easily deposited, inexpensive, and readily bondable to Al bond wires. Additionally or alternatively, other materials, such as Cu, can be used. Furthermore, physical features and/or patterns of the pad metal and/or the diffusion barrier can be defined by material removal processes, such as a lithographical wet etch.

The thickness of the pad metal can vary, depending on composition, desired functionality, and/or other factors. The pad metal can be relatively thick to help ensure the structural integrity of the pad metal can withstand a subsequent wire bonding process. In particular, the Al wire bonding process exerts large forces on the pad metal. A thick pad metal can absorb these forces to prevent damage to the underlying GaN device layers. In some embodiments, for example, the thickness of the pad metal can be between 2 and 6 microns. In one embodiment, thickness is in the range of 3.5 to 4.5 microns. In the embodiment of FIG. 5, transistor 530 may utilize a topside metal (i.e. gate electrode and source electrode) that is compatible with wire bonding, ribbon bonding, copper clips, and/or other topside contact methods. The backside metal (i.e., cathode) of diode 540 may comprise similar metal layers, such that when the diode is mounted topside down, the upward facing backside metal of the diode die is compatible with the same topside contact methods. Moreover, the transistor die and diode die may share one or more die top-side contact processes. For example, copper clips may be attached to the upward facing surfaces of both die during the same processing step.

Techniques for providing a bondable contact metal may be used in conjunction with techniques for providing a solderable contact metal. These techniques for providing a solderable contact metal are also discussed in and U.S. patent application Ser. No. 13/611,467, filed Sep. 12, 2012, entitled "BONDABLE TOP METAL CONTACT FOR GALLIUM NITRIDE POWER DEVICES," which are incorporated by reference into this application for all purposes.

The exposed leadframe 535 of package 500-A may be soldered to a heat sink (not shown) to facilitate heat removal from the power devices. Since the GaN transistor 530 and GaN diode 540 are co-packaged and share the same leadframe, only one heat sink may be soldered to the electronic package, reducing the overall size, weight, and bulk of the electronic package. If the GaN transistor and GaN diode were to be packaged separately, each package would be typically be mounted to a heat sink, adding size and weight to the overall power converter.

Co-packaging the GaN transistor and the GaN diode also reduces additional parasitic effects that result from separately packaging the devices and using interconnections between both packages. The longer and thinner are the interconnections between separate packages, the more inductance and resistance is introduced. Mounting the separate packages further apart on a circuit board magnifies the problems, resulting in ringing as these inductances are switching at high currents and high voltages and transitioning quickly, which also causes EMI problems. Increased EMI generates high frequency radiation which may negatively affect control circuit 520 and/or other devices mounted on the same circuit board as the GaN transistor package and GaN diode package.

Illustratively, the resulting package of co-packaging a GaN transistor with a GaN diode may be much smaller than conventional silicon packages using conventional techniques. For example, a 600V/5 A GaN transistor and 600V/5 A GaN diode may be co-packaged in a 3 mm×4 mm package, while a conventional TO220 package for a 600V/5 A silicon transistor and a separate package for a 600V/5 A silicon diode measures approximately 10 mm×15 mm each. As such, the electronic package for a GaN electronic circuit may be 10 to 100 times smaller than a package for the corresponding silicon electronic circuit. In conventional TO220 packages, tabs may be at different voltages, therefore attached to separate heat sinks, which makes conventional TO220 packages of silicon devices and circuits even larger.

Furthermore, dual flat no-lead package that can be utilized with the co-packaged GaN transistor and GaN diode described herein may cost far less than traditional TO220 packages (e.g., 25-75% of the cost per package). The reduced size and bulk of co-packaged GaN devices results in reduced circuit board space, also lowering the cost assembly and manufacture of circuit boards and its enclosures. Additionally, since embodiments can utilize only one leadframe and one heat sink, materials and manufacturing costs are reduced further. For at least these reasons, methods and systems for manufacturing and fabricating GaN packages are more cost-effective and efficient than conventional methods and systems.

Figure 6:
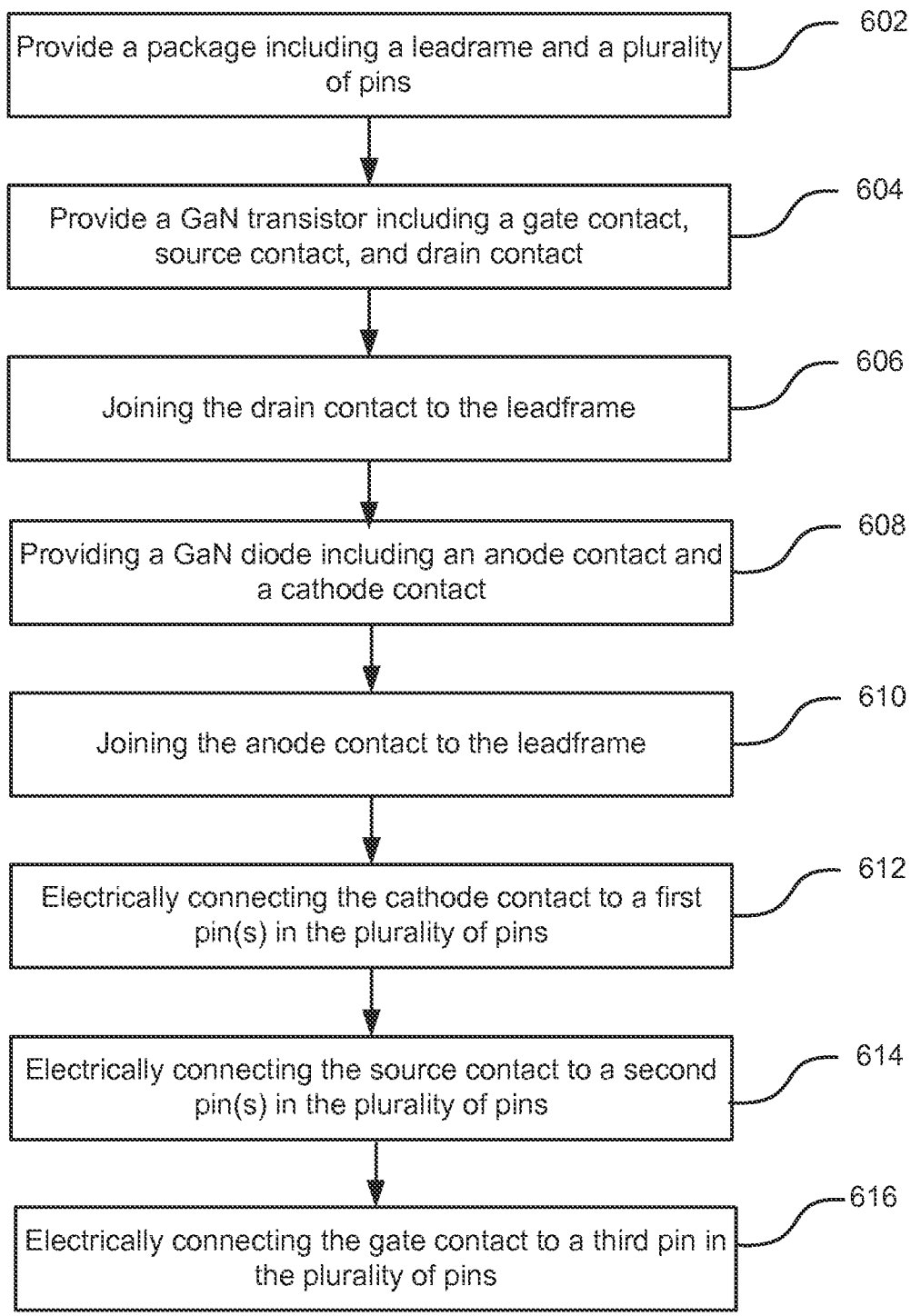
FIG. 6 is a simplified flowchart illustrating a method of fabricating a co-packaged GaN electronic device according to an embodiment of the present invention.

FIG. 6 is a simplified flowchart illustrating a method of fabricating a GaN-based electronics package where a vertical GaN transistor is co-packaged with a GaN diode according to an embodiment of the present invention. The method includes providing a package including a leadframe and a plurality of pins (602). Next, a GaN transistor is provided (604). The GaN transistor may include a drain region, a drift region, a source region, and a gate region. In some embodiments, the drain region may comprise a GaN substrate and a drain contact. The source region may comprise a first GaN layer coupled to the GaN substrate and a source contact. The gate region may comprise a second GaN layer coupled to the GaN substrate and a gate contact. The method further includes joining the drain contact of the GaN transistor to the leadframe (606).

In an embodiment, the GaN substrate is a n-type GaN substrate, and the drift region may be a first GaN epitaxial layer coupled to a front surface of the gallium nitride substrate. The first GaN epitaxial layer is characterized by a first dopant concentration, for example n-type doping with dopant concentrations ranging from $1\times10^{14}$ cm$^{-3}$ to $1\times10^{18}$ cm$^{-3}$. The thickness of the first GaN epitaxial layer may vary, depending on the process used to form the layer and the device design. For example, using homoepitaxy techniques, the thickness of the first GaN epitaxial layer may be between 1 μm and 100 μm. The gate region may be a second GaN epitaxial layer of an opposite type from the first GaN epitaxial layer coupled to the first GaN epitaxial later. The dopant concentration of the second GaN epitaxial layer may exceed the dopant concentrations of the first GaN epitaxial layer. For example, a p-type dopant concentration of the second GaN epitaxial layer can be equal to or greater than $1\times10^{18}$ cm$^{-3}$. The thickness of the second GaN epitaxial layer may vary, depending on the process used to form the layer and the device design. In some embodiments, the thickness of the second GaN epitaxial layer may be between 0.1 μm and 5 μm.

The method further includes providing a GaN diode including an anode region and a cathode region (608). The cathode region may comprise the GaN substrate and a cathode contact. The anode region may comprise a GaN epitaxial layer coupled to the GaN substrate and an anodecontact. The method includes joining the anode contact to the leadframe (610), which is also joined with the drain contact of the GaN transistor.

The GaN epitaxial layer of the GaN diode may be coupled to the front surface of the GaN substrate, and may have similar properties to that of the first GaN epitaxial layer of the GaN transistor. According to an embodiment of the present invention, the GaN diode is flipped such that the anode region shares the same GaN substrate of the drain region of the GaN transistor.

The method further includes electrically connecting the cathode contact to a first pin in the plurality of pins of the leadframe (612). In an embodiment of the invention, to accommodate high currents, the cathode contact may be electrically connected to one or more additional pins. The source contact is electrically connected to a second pin in the plurality of pins (614), and the gate contact is electrically connected to a third pin in the plurality of pins (616)

It should be appreciated that the specific steps illustrated in FIG. 6 provide a particular method of fabricating a vertical power device according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An electronic package comprising:
    a leadframe;
    a plurality of pins;
    a gallium nitride (GaN) transistor comprising a drain region, a drift region, a source region, and a gate region, wherein:

the drain region comprises a GaN substrate and a drain contact;

the drift region comprises a first GaN epitaxial layer coupled to the GaN substrate;

the source region is separated from the GaN substrate by the drift region and comprises a source contact;

the gate region comprises a second GaN epitaxial layer coupled to the first GaN epitaxial layer and a gate contact;

a GaN diode comprising an anode region and a cathode region, wherein:

the cathode region comprises the GaN substrate and a cathode contact; and the anode region comprises a third GaN epitaxial layer coupled to the GaN substrate and an anode contact;

wherein the drain contact and the anode contact are electrically connected to the leadframe.

2. The electronic package of claim 1 wherein:

the cathode contact is electrically connected to a first pin of the plurality of pins;

the source contact is electrically connected to a second pin in the plurality of pins; and the gate contact is electrically connected to a third pin in the plurality of pins.

3. The electronic package of claim 2 wherein:

the electrical connections of the cathode contact, the source contact, and the gate contact comprises at least one of wire bonds, ribbon bonds, or copper clips.

4. The electronic package of claim 3 wherein the electrical connection of the cathode contact is connected to the first pin and an additional one or more pins of the plurality of pins.

5. The electronic package of claim 1 wherein the electrical connection between the drain contact and the leadframe comprises at least one of epoxy, eutectic, sintering, or solder.

6. The electronic package of claim 2 wherein the electrical connection between the anode contact and the leadframe comprises at least one of epoxy, eutectic, sintering, or solder.

7. The electronic package of claim 1 wherein the gallium nitride-based electronics package is electrically coupled and attached to a circuit board, wherein the leadframe is configured to conduct current from the drain region of the GaN transistor and the anode region of the GaN diode directly to the circuit board.

8. The electronic package of claim 1 further comprising one or more heat sinks attached to the leadframe.

9. The electronic package of claim 1 further comprising a solderable metal stack on the drain contact and a bondable metal stack on each of the source contact and gate contact.

10. The electronic package of claim 9 further comprising a second solderable metal stack on the anode contact and a second bondable metal stack on the cathode contact.

11. The electronic package of claim 1 wherein the leadframe comprises a bond pad, and further wherein the drain contact and the anode contact are electrically connected to the leadframe via the bond pad.

* * * * *